United States Patent
Obata et al.

(10) Patent No.: US 11,262,394 B2
(45) Date of Patent: Mar. 1, 2022

(54) METHOD FOR INSPECTING PIEZOELECTRIC ELEMENT

(71) Applicant: NGK Insulators, Ltd., Nagoya (JP)

(72) Inventors: Hiroki Obata, Gifu (JP); Masayuki Uetani, Kasugai (JP); Ryusuke Ikeda, Ichinomiya (JP)

(73) Assignee: NGK Insulators, Ltd., Nagoya (JP)

( * ) Notice: Subject to any disclaimer, the term of this patent is extended or adjusted under 35 U.S.C. 154(b) by 44 days.

(21) Appl. No.: 16/814,206

(22) Filed: Mar. 10, 2020

(65) Prior Publication Data

US 2020/0209302 A1 Jul. 2, 2020

Related U.S. Application Data

(63) Continuation of application No. PCT/JP2018/033486, filed on Sep. 10, 2018.

(30) Foreign Application Priority Data

Sep. 12, 2017 (JP) .............................. JP2017-174832

(51) Int. Cl.
*G01R 31/26* (2020.01)
*H01L 41/083* (2006.01)

(52) U.S. Cl.
CPC .......... *G01R 31/26* (2013.01); *H01L 41/0838* (2013.01)

(58) Field of Classification Search
CPC ...... G01R 31/26; G01R 29/22; H01L 41/0838
See application file for complete search history.

(56) References Cited

U.S. PATENT DOCUMENTS

| 8,035,281 B2* | 10/2011 | Shibata ............... H01L 41/0815 310/358 |
| 2008/0030102 A1* | 2/2008 | Ohnishi ............... B41J 2/04541 310/317 |
| 2012/0146671 A1* | 6/2012 | Furuta .................... G01N 27/02 324/727 |

(Continued)

FOREIGN PATENT DOCUMENTS

| JP | 2002-190457 A1 | 7/2002 |
| JP | 2013-161970 A1 | 8/2013 |

(Continued)

OTHER PUBLICATIONS

English translation of the International Preliminary Report on Patentability (Chapter I)(Application No. PCT/JP2018/033486) dated Mar. 17, 2020.

(Continued)

*Primary Examiner* — Tung X Nguyen
*Assistant Examiner* — Feba Pothen
(74) *Attorney, Agent, or Firm* — Burr & Brown, PLLC (57) ABSTRACT

Provided is a method for inspecting a piezoelectric element in which voltage is applied to a piezoelectric element and evaluation of the electrical characteristics of the piezoelectric element is performed. The method includes a first step in which the piezoelectric element is held on a flat plate-shaped slightly adhesive sheet and a second step in which voltage is applied to the piezoelectric element held on the slightly adhesive sheet and evaluation of the electrical characteristics of the piezoelectric element is performed.

7 Claims, 7 Drawing Sheets

(56) References Cited

U.S. PATENT DOCUMENTS

| | | | |
|---|---|---|---|
| 2013/0069490 A1* | 3/2013 | Nakamura | H01L 41/0986 |
| | | | 310/364 |
| 2016/0056366 A1 | 2/2016 | Nakamura | |
| 2017/0092835 A1 | 3/2017 | Uetani et al. | |
| 2017/0268973 A1* | 9/2017 | Arai | G01N 3/32 |

FOREIGN PATENT DOCUMENTS

| | | |
|---|---|---|
| JP | 2014-181126 A1 | 9/2014 |
| WO | 2015/060132 A1 | 4/2015 |
| WO | 2015/194461 A1 | 12/2015 |

OTHER PUBLICATIONS

International Search Report and Written Opinion (Application No. PCT/JP2018/033486) dated Nov. 27, 2018.

* cited by examiner

【TABLE 1】

|  | THICKNESS ta (mm) | DIELECTRIC LOSS TANGENT (tan θ) | MATERIAL | IMPEDANCE (Ω) | EVALUATION |
|---|---|---|---|---|---|
| SAMPLE 1 | 0.03 | 0.23 | FLUORORUBBER | 170 | B |
| SAMPLE 2 | 0.03 | 0.20 | FLUORORUBBER | 240 | A |
| SAMPLE 3 | 0.03 | 0.17 | FLUORORUBBER | 260 | A |
| SAMPLE 4 | 0.10 | 0.25 | FLUORORUBBER | 150 | B |
| SAMPLE 5 | 0.10 | 0.15 | FLUORORUBBER | 220 | A |
| SAMPLE 6 | 0.10 | 0.03 | FLUORORESIN | 330 | A |
| SAMPLE 7 | 0.15 | 0.25 | FLUORORUBBER | 150 | B |
| SAMPLE 8 | 0.15 | 0.23 | FLUORORUBBER | 150 | B |
| SAMPLE 9 | 0.20 | 0.25 | FLUORORUBBER | 150 | B |
| SAMPLE 10 | 0.20 | 0.15 | FLUORORUBBER | 200 | A |
| SAMPLE 11 | 0.20 | 0.05 | OLEFIN | 300 | A |
| SAMPLE 12 | 0.20 | 0.03 | FLUORORESIN | 320 | A |
| SAMPLE 13 | 0.30 | 0.20 | FLUORORUBBER | 150 | B |
| SAMPLE 14 | 0.30 | 0.05 | OLEFIN | 280 | A |
| SAMPLE 15 | 0.30 | 0.03 | FLUORORESIN | 300 | A |
| SAMPLE 16 | 0.40 | 0.15 | FLUORORUBBER | 150 | B |
| SAMPLE 17 | 0.40 | 0.15 | OLEFIN | 150 | B |
| SAMPLE 18 | 0.40 | 0.05 | OLEFIN | 260 | A |
| SAMPLE 19 | 0.40 | 0.03 | FLUORORESIN | 280 | A |
| SAMPLE 20 | 0.50 | 0.15 | OLEFIN | 150 | B |
| SAMPLE 21 | 0.50 | 0.05 | OLEFIN | 240 | A |
| SAMPLE 22 | 0.50 | 0.03 | FLUORORESIN | 400 | A |

METHOD FOR INSPECTING PIEZOELECTRIC ELEMENT

CROSS-REFERENCE TO RELATED APPLICATIONS

This application is a Continuation of International Application No. PCT/JP2018/033486 filed on Sep. 10, 2018, which is based upon and claims the benefit of priority from Japanese Patent Application No. 2017-174832 filed on Sep. 12, 2017, the contents all of which are incorporated herein by reference.

BACKGROUND OF THE INVENTION

1. Field of the Invention

The present invention relates to a piezoelectric element inspection method for evaluating electric properties of piezoelectric elements.

2. Description of Related Art

Conventionally, piezoelectric element property inspections evaluate electric properties of piezoelectric elements (quality inspections etc.) by applying voltage to the piezoelectric elements to cause displacement of the piezoelectric elements. For example, the technique described in Japanese Laid-Open Patent Publication No. 2002-190457 performs an electric property evaluation of piezoelectric elements with a plurality of piezoelectric elements stuck on an adhesive sheet. Also, the technique described in Japanese Laid-Open Patent Publication No. 2014-181126 performs an electric property evaluation of piezoelectric elements with the piezoelectric elements placed in recesses in a tray.

SUMMARY OF THE INVENTION

However, in the method described in Japanese Laid-Open Patent Publication No. 2002-190457, the adhesive sheet hinders the displacement of the piezoelectric elements that occurs when the voltage is applied to the piezoelectric elements. Accordingly, the stress occurring in the piezoelectric elements in the voltage application becomes large and may cause cracks in the piezoelectric elements.

Figure 7A:
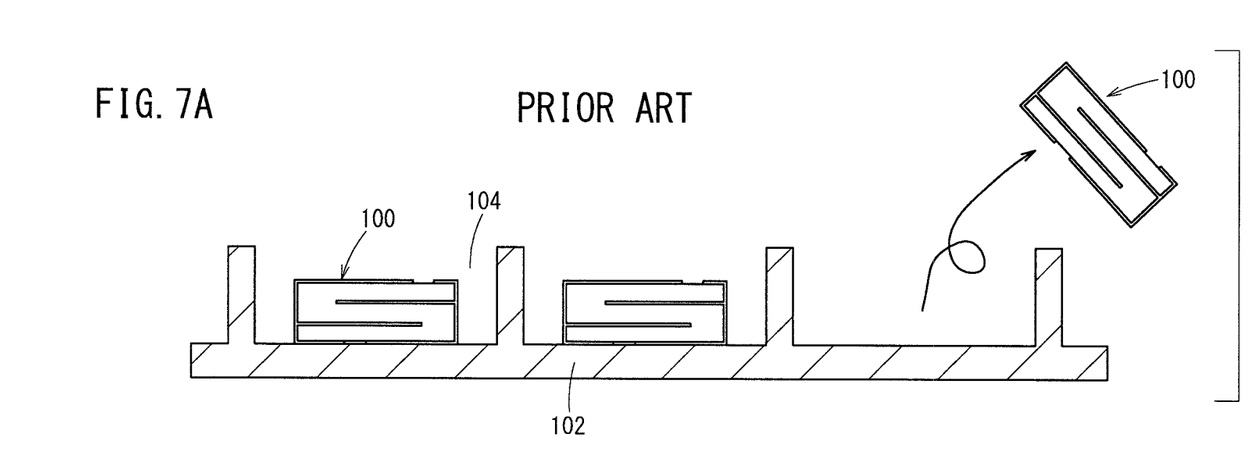
FIG. 7A is an explanatory diagram showing an example of a problem of the use of a conventional tray.
Figure 7B:
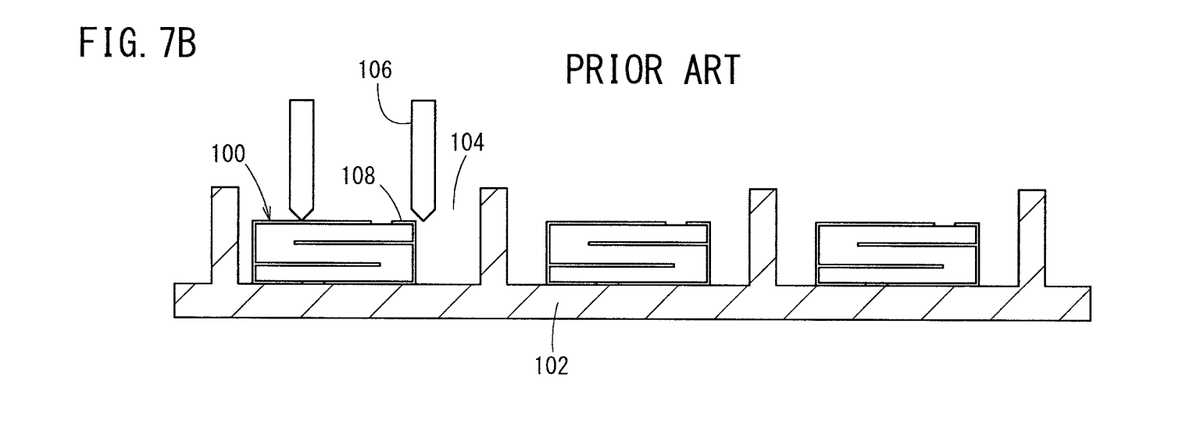
FIG. 7B is an explanatory diagram showing another example of a problem of the use of the conventional tray.

In the method described in Japanese Laid-Open Patent Publication No. 2014-181126 that employs the tray, as shown in FIG. 7A, it is necessary to set the plane size of each recess 104 in the tray 102 slightly larger than the plane size of the piezoelectric elements 100 so that the piezoelectric elements 100 can be easily put into and taken out of the recesses 104. Consequently, the piezoelectric elements 100 may be turned over due to impact during transportation of the tray 102 between processes or during operation of installing the tray 102 in apparatus. Also, the piezoelectric elements 100 may be lost during handling. Furthermore, as shown in FIG. 7B, when a voltage is applied to the piezoelectric element 100, the position of the piezoelectric element 100 may be shifted in the recess 104, so that the contact between the probe 106 and terminal 108 cannot be stable, possibly resulting in inspection failure.

The present invention has been devised taking such problems into consideration and an object of the present invention is to provide a piezoelectric element inspection method that offers the effects below:

(a) even if a tray on which a plurality of piezoelectric elements are arranged in alignment undergoes impact, a property inspection can be performed while keeping the alignment of the piezoelectric elements; and (b) the displacement (deformation) of the piezoelectric elements that occur at the application of voltage is not hindered.

[1] According to the present invention, a piezoelectric element inspection method for performing an electric property evaluation of a piezoelectric element by applying a voltage to the piezoelectric element, includes: a first step of holding the piezoelectric element on a flat-plate-shaped slightly adhesive sheet; and a second step of applying the voltage to the piezoelectric element held on the slightly adhesive sheet to perform the electric property evaluation of the piezoelectric element.

According to this method, the piezoelectric element is held on the slightly adhesive sheet. Thus, even if a tray on which a plurality of piezoelectric elements are arranged in alignment undergoes impact, the property inspection can be performed while keeping the alignment of the piezoelectric elements. Furthermore, the displacement of the piezoelectric elements that occurs at the application of voltage is not hindered.

[2] According to the present invention, the piezoelectric element may have a first terminal and a second terminal formed on one surface thereof, the first step may hold, on the slightly adhesive sheet, the other surface of the piezoelectric element that is opposite to the one surface, and the second step may apply the voltage between the first terminal and the second terminal of the piezoelectric element.

The first step holds on the slightly adhesive sheet the piezoelectric element by its other surface opposite to the one surface. Thus, the second step can perform the property inspection by applying the voltage between the first terminal and second terminal that are formed on the one surface of the piezoelectric element. That is, the piezoelectric element property inspection can be easily performed with the piezoelectric element held on the slightly adhesive sheet.

[3] In the present invention, preferably, the piezoelectric element has a size having a length of 0.2 to 0.4 mm, a width of 0.8 to 1.2 mm, and a thickness of 0.05 to 0.2 mm. This prevents cracks or the like from occurring in the piezoelectric element in the property inspection, and thus offers improved yield.

[4] In the present invention, when the piezoelectric element is subjected to the voltage for the property inspection, a strain of 1500 to 4000 ppm in d31 direction (a direction along the electrode surface) may occur with an electric field of 2.0 to 4.0 kV/mm.

[5] In the present invention, preferably, the flat-plate-shaped slightly adhesive sheet is bonded on a base material, the base material is flat in at least a plane on which the slightly adhesive sheet is bonded, and the slightly adhesive sheet is bonded within the plane. This prevents the slightly adhesive sheet from being wrinkled or partially turned over by air-conditioning wind etc., so that a plurality of piezoelectric elements can be held stably.

Further, more preferably, the base material is made of metal from the perspective of processing accuracy and heat conduction during heating, and still more preferably made of aluminum from the perspective of heat conduction.

[6] In the present invention, preferably, the slightly adhesive sheet holds the piezoelectric element and does not hinder the displacement of the piezoelectric element that occurs when the voltage is applied.

Then, even if a strain of 1500 to 4000 ppm occurs in d31 direction at an electric field of 2.0 to 4.0 kV/mm when the voltage is applied to the piezoelectric element, it is possible to perform the property inspection without hindering the displacement of the piezoelectric element, with the piezoelectric element held on the slightly adhesive sheet.

[7] In the present invention, preferably, the slightly adhesive sheet has the following relations (a) to (d) between a thickness ta and a dielectric loss tangent tanθ:
(a) tanθ≤0.20 when 0.03 mm≤ta≤0.05 mm
(b) tanθ≤0.15 when 0.05 mm≤ta≤0.10 mm
(c) tanθ≤0.10 when 0.10 mm≤ta≤0.20 mm
(d) tanθ≤0.05 when 0.20 mm≤ta≤0.50 mm

[8] According to the present invention, preferably, the slightly adhesive sheet has property values including a surface resistance equal to or greater than $10^{16}$ ohms, a Young's modulus of 5.0 to 10.0 MPa, a heat conductivity equal to or greater than 0.05 W/mK, a holding power equal to or less than 0.50 kgf/cm$^2$, and a heat resistance equal to or higher than 90° C.

The piezoelectric element inspection method according to the present invention offers the effects below:

(a) even if a tray on which a plurality of piezoelectric elements are arranged in alignment undergoes impact, a property inspection can be performed while keeping the alignment of the piezoelectric elements; and (b) the displacement of the piezoelectric elements that occur at the application of voltage is not hindered.

DETAILED DESCRIPTION OF THE INVENTION

An embodiment of the piezoelectric element inspection method of the present invention will now be described referring to FIGS. 1 to 6. In this specification, the word "to" indicating a numerical range is used to mean that the range includes the preceding and following numerical values as its lower and upper limit values.

Figure 1:
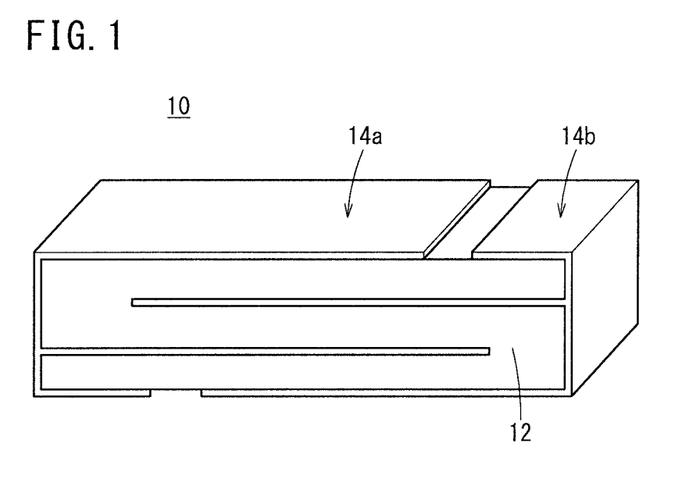
FIG. 1 is a perspective view showing an example of a piezoelectric element that is subjected to a property inspection by the piezoelectric element inspection method according to the present embodiment.

As shown in FIG. 1, for example, a piezoelectric element 10, which is an inspection target for the piezoelectric element inspection method of this embodiment, includes an element body 12 composed of perovskite structure etc. and a pair of electrodes 14a, 14b that are formed, for example, on upper and lower surfaces of the element body 12. The piezoelectric element 10 has a structure in which the element body 12 is formed as a laminated structure and the pair of electrodes 14a, 14b are each formed into a comb teeth shape. In this case, the pair of electrodes 14a, 14b are formed in such a manner that they appear on the upper surface of the element body 12.

Figure 2:
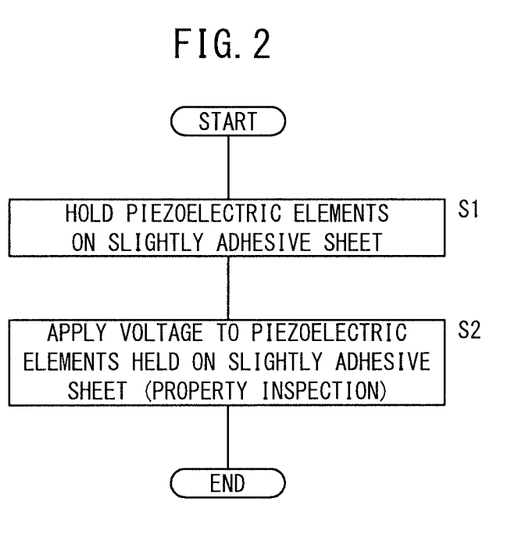
FIG. 2 is a flowchart showing the piezoelectric element inspection method according to the present embodiment.
Figure 3A:
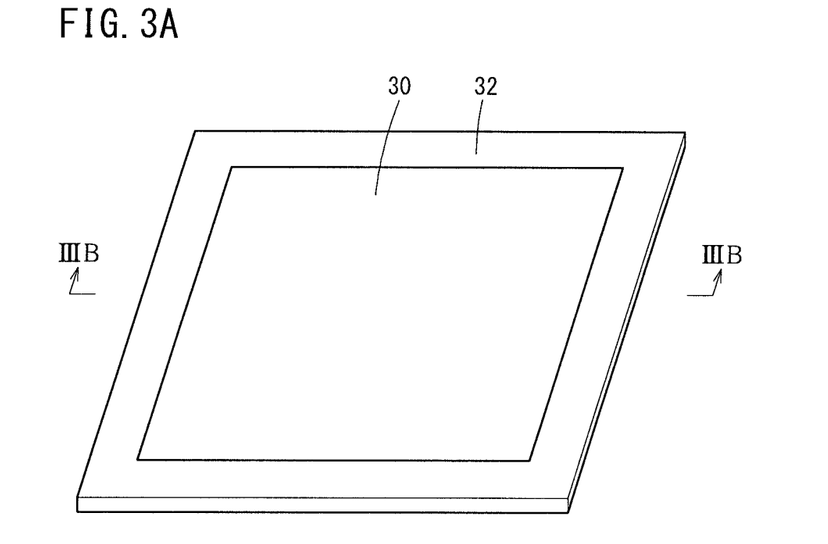
FIG. 3A is a perspective view showing an example of a slightly adhesive sheet bonded on a base material.
Figure 3B:
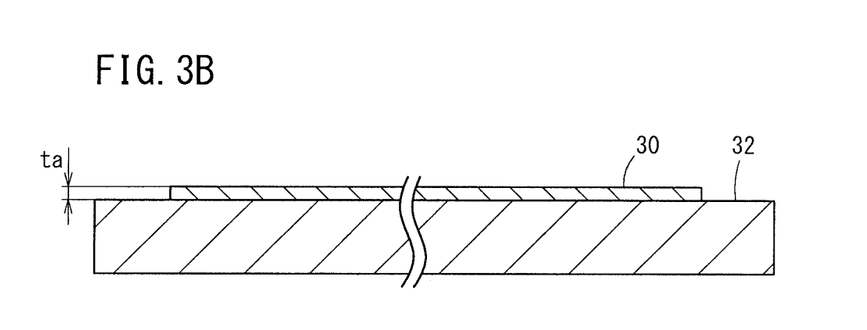
FIG. 3B is a cross sectional view taken along line IIIB-IIIB in FIG. 3A.

Then, in the piezoelectric element inspection method of this embodiment, as shown in step S1 of FIG. 2, the piezoelectric elements 10 (see FIG. 1) are held on a flat-plate-shaped slightly adhesive sheet 30 (see FIGS. 3A and 3B). Subsequently, in step S2, a voltage is applied to the piezoelectric elements 10 held on the slightly adhesive sheet 30 so as to evaluate electric properties of the piezoelectric elements 10 by measuring deformation or natural frequency of the piezoelectric elements 10.

The piezoelectric elements 10 are produced through the processes below, for example. That is, a green laminate including green sheet and electrode film is fired to produce a large-sized piezoelectric substrate not shown. Subsequently, the large-sized piezoelectric substrate is subjected to piezoelectric treatment and divided into a plurality of pieces to thereby produce a plurality of piezoelectric elements 10. Needless to say, a plurality of piezoelectric elements 10 may be produced by first dividing a large-sized piezoelectric substrate into a plurality of pieces (piezoelectric substrate pieces) and then applying piezoelectric treatment to each piezoelectric substrate piece.

As shown in FIGS. 3A and 3B, the plate-shaped slightly adhesive sheet 30 is bonded on a base material 32 made of metal or ceramic. It is preferred that at least a plane of the base material 32 on which the slightly adhesive sheet 30 is bonded is flat, and that the slightly adhesive sheet 30 is bonded within the plane. This prevents the slightly adhesive sheet 30 from being wrinkled or partially turned over by air-conditioning wind etc., so that the plurality of piezoelectric elements 10 can be held stably. Further, more preferably, the base material 32 is made of metal from the perspective of processing accuracy and heat conduction during heating, and still more preferably, it is made of aluminum from the perspective of heat conduction.

Figure 4A:
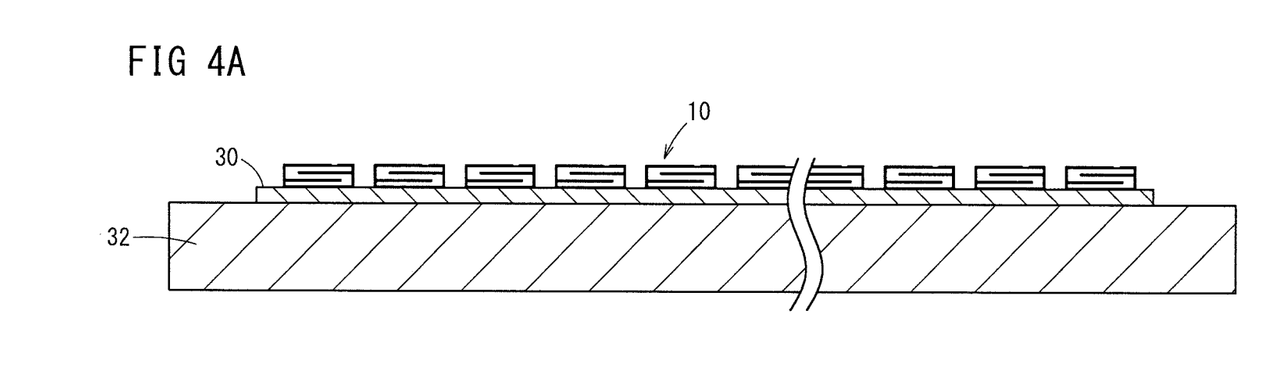
FIG. 4A is a partially-omitted cross sectional view illustrating a plurality of piezoelectric elements held on the slightly adhesive sheet bonded on the base material.

Thus, in step S1, as shown in FIG. 4A, the plurality of piezoelectric elements 10 are aligned (arranged) and held on the slightly adhesive sheet 30 using an alignment jig, for example. As to the manner of the alignment, for example, it is preferable to arrange the plurality of piezoelectric elements 10 in a matrix, with the plurality of piezoelectric elements 10 arranged in a length direction and width direction. It is also preferred that the slightly adhesive sheet 30 can keep the alignment of the plurality of piezoelectric elements 10 even when subjected to impact through the base material 32 or directly.

Figure 4B:
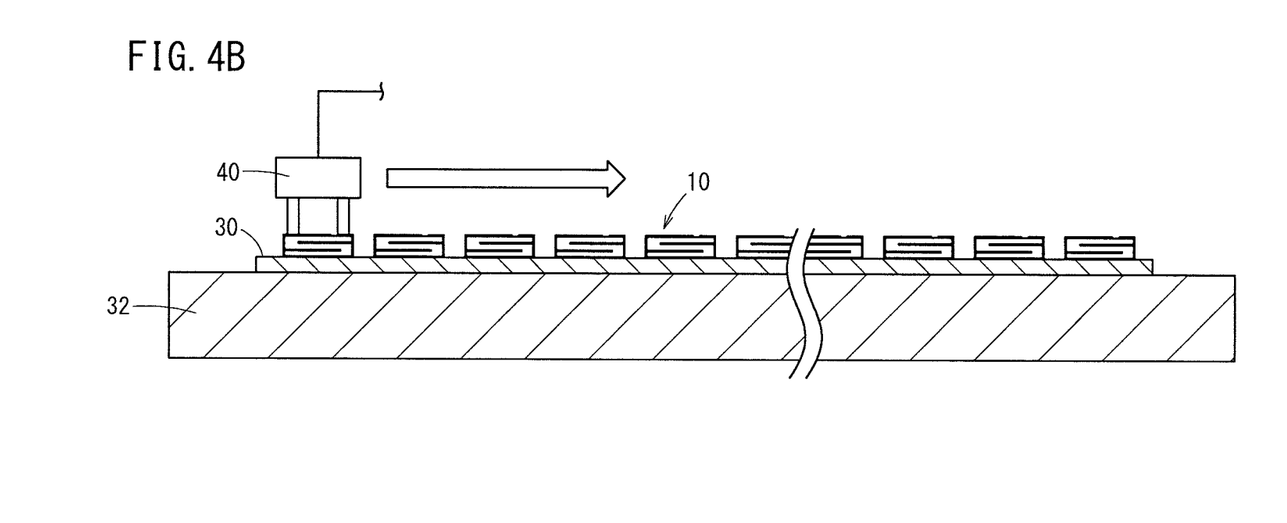
FIG. 4B is a partially-omitted cross sectional view illustrating a situation where a voltage is being applied to the plurality of piezoelectric elements held on the slightly adhesive sheet.

As shown in FIG. 4B, the inspection process in step S2 is performed with the plurality of piezoelectric elements 10 aligned on the slightly adhesive sheet 30. For example, the electric property inspection is performed on the plurality of piezoelectric elements 10 in turn by using one voltage application device 40. Needless to say, the electric property inspection may be performed on the plurality of piezoelectric elements 10 at once, or separately in multiple times, using multiple voltage application devices 40 connected thereto. When each piezoelectric element 10 undergoes the electric property inspection, a strain of 1500 to 4000 ppm occurs in d31 direction (a direction along the electrode surface) at an electric field of 2.0 to 4.0 kV/mm.

It is hence preferred that the slightly adhesive sheet 30 has such a holding power as not to hinder the strain (displacement) of the plurality of piezoelectric elements 10 that occurs in the property inspection in step S2. That is, the holding of the piezoelectric elements 10 by the slightly adhesive sheet 30 corresponds to physical adhesion (secondary bond, intermolecular bond), which is one of the adhesion principles.

Preferably, the slightly adhesive sheet 30 has property values of a surface resistance equal to or greater than $10^{16}$ ohms, a Young's modulus of 5.0 to 10.0 MPa, a heat conductivity equal to or greater than 0.05 W/mK, a holding power equal to or less than 0.50 kgf/cm², and a heat resistance equal to or higher than 90° C. The holding power of the slightly adhesive sheet 30 is preferably 0.10 kgf/cm² or higher.

EXAMPLE 1

[First Example]

A first example examined a preferred relation between a thickness "ta" (see FIG. 3B) and a dielectric loss tangent (dissipation factor) tanθ of the slightly adhesive sheet 30.

Specifically, samples 1 to 22 (slightly adhesive sheets 30) were prepared and the resistance value (Ω: ohm) at the resonance frequency (7.2 to 7.9 MHz) of each sample was measured. Details of the samples are shown in Table 1 of FIG. 5.

[Samples 1 to 3]

The slightly adhesive sheets 30 of the samples 1 to 3 all had a thickness ta of 0.03 mm. The sample 1 had a dielectric loss tangent (tanθ) of 0.23 and was made of fluororubber. The sample 2 had a dielectric loss tangent (tanθ) of 0.20 and was made of fluororubber. The sample 3 had a dielectric loss tangent (tanθ) of 0.17 and was made of fluororubber.

[Samples 4 to 6]

The slightly adhesive sheets 30 of the samples 4 to 6 all had a thickness ta of 0.10 mm. The sample 4 had a dielectric loss tangent (tanθ) of 0.25 and was made of fluororubber. The sample 5 had a dielectric loss tangent (tanθ) of 0.15 and was made of fluororubber. The sample 6 had a dielectric loss tangent (tanθ) of 0.03 and was made of fluororesin.

[Samples 7, 8]

The slightly adhesive sheets 30 of the samples 7 and 8 each had a thickness ta of 0.15 mm. The sample 7 had a dielectric loss tangent (tanθ) of 0.25 and was made of fluororubber. The sample 8 had a dielectric loss tangent (tanθ) of 0.23 and was made of fluororubber.

[Samples 9 to 12]

The slightly adhesive sheets 30 of the samples 9 to 12 all had a thickness ta of 0.20 mm. The sample 9 had a dielectric loss tangent (tanθ) of 0.25 and was made of fluororubber. The sample 10 had a dielectric loss tangent (tanθ) of 0.15 and was made of fluororubber. The sample 11 had a dielectric loss tangent (tanθ) of 0.05 and was made of olefin. The sample 12 had a dielectric loss tangent (tanθ) of 0.03 and was made of fluororesin.

[Samples 13 to 15]

The slightly adhesive sheets 30 of the samples 13 to 15 all had a thickness ta of 0.30 mm. The sample 13 had a dielectric loss tangent (tanθ) of 0.20 and was made of fluororubber. The sample 14 had a dielectric loss tangent (tanθ) of 0.05 and was made of olefin. The sample 15 had a dielectric loss tangent (tanθ) of 0.03 and was made of fluororesin.

[Samples 16 to 19]

The slightly adhesive sheets 30 of the samples 16 to 19 all had a thickness ta of 0.40 mm. The sample 16 had a dielectric loss tangent (tanθ) of 0.15 and was made of fluororubber. The sample 17 had a dielectric loss tangent (tanθ) of 0.15 and was made of olefin. The sample 18 had a dielectric loss tangent (tanθ) of 0.05 and was made of olefin. The sample 19 had a dielectric loss tangent (tanθ) of 0.03 and was made of fluororesin.

[Samples 20 to 22]

The slightly adhesive sheets 30 of the samples 20 to 22 all had a thickness ta of 0.50 mm. The sample 20 had a dielectric loss tangent (tanθ) of 0.15 and was made of olefin. The sample 21 had a dielectric loss tangent (tanθ) of 0.05 and was made of olefin. The sample 22 had a dielectric loss tangent (tanθ) of 0.03 and was made of fluororesin.

[Evaluation]

Samples having resistance values of 200 (Ω) or higher at the resonance frequencies (7.2 to 7.9 MHz) were evaluated as "A", and samples having resistance values of less than 200 (Ω) were evaluated as "B".

Figure 5:
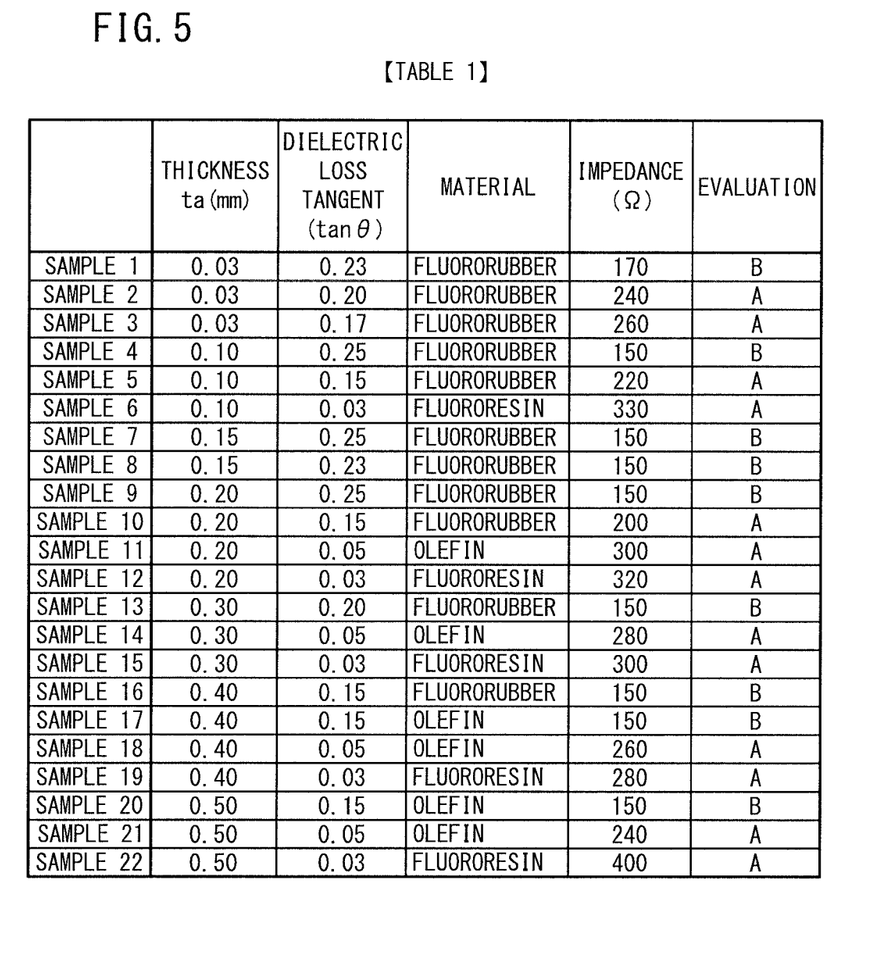
FIG. 5 is Table 1 showing the details of samples 1 to 22 and the results of evaluation.
Figure 6:
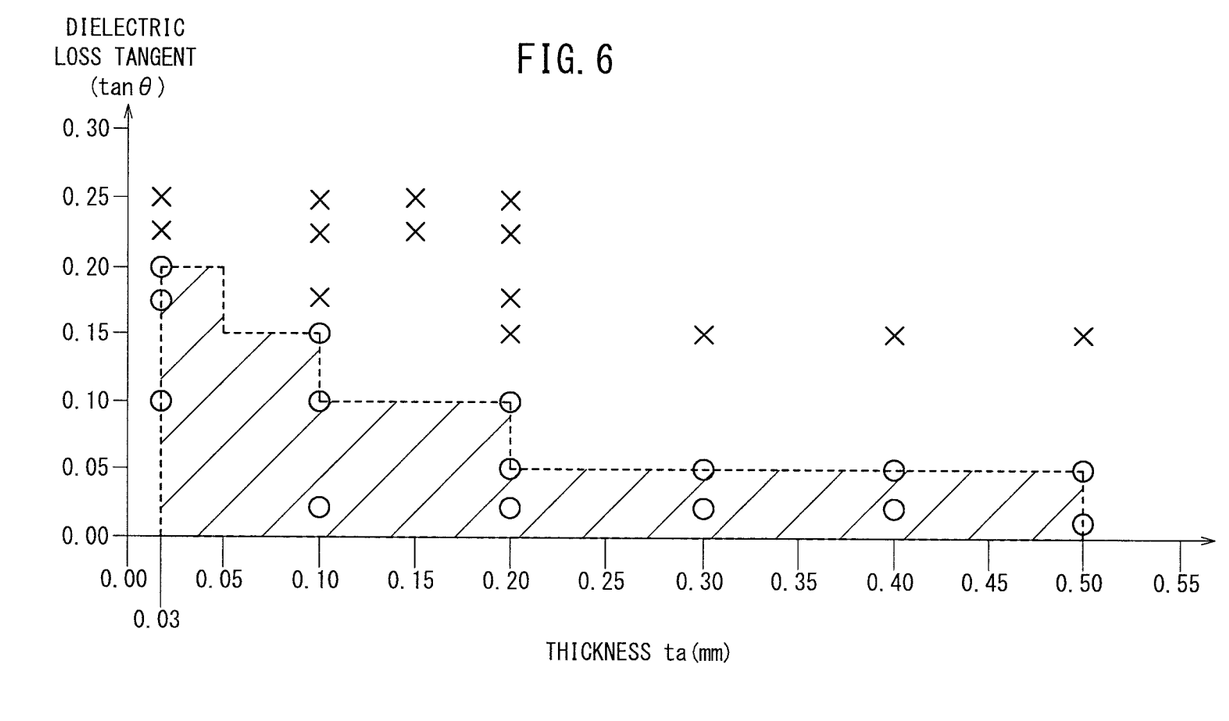
FIG. 6 is a diagram graphically showing the relations between thickness and dielectric loss tangent (tanθ) of Table 1.

Table 1 of FIG. 5 and FIG. 6 show the results of evaluation of the samples. FIG. 6 is a diagram graphically showing the relations between the thickness ta and the dielectric loss tangent (tanθ) of Table 1. In FIG. 6, "0" denotes data associated with evaluation "A" and "x" denotes data associated with evaluation "B".

The results of evaluation above show that it is preferred that the slightly adhesive sheet 30 has the following relations (a) to (d) between the thickness ta and dielectric loss tangent tanθ.

(a) tanθ≤0.20 when 0.03 mm≤ta≤0.05 mm
(b) tanθ≤0.15 when 0.05 mm≤ta≤0.10 mm
(c) tanθ≤0.10 when 0.10 mm≤ta≤0.20 mm
(d) tanθ≤0.05 when 0.20 mm≤ta≤0.50 mm Second Example A second example examined the yield and retry rate of an example and a comparative example.

In the example, 100 piezoelectric elements 10 were held in alignment on the slightly adhesive sheet 30 of the sample 6 above by using an alignment device, the surface temperature of the base material 32 on which the slightly adhesive sheet 30 was bonded was set at 90±5° C., and a property inspection was conducted by applying a voltage of 53±2 V between the pair of electrodes 14a, 14b of each piezoelectric element 10.

Capacitance inspection and resonance inspection were conducted as the electric property evaluation. In the capacitance inspection, using an LCR meter, the probe was brought into contact with the electrodes 14a, 14b of each piezoelectric element 10 and capacitance was measured by applying a measurement signal at a voltage of 0.5 V and a frequency of 1 kHz.

In the resonance inspection, using a network analyzer, the probe was brought into contact with the electrodes 14a, 14b of each piezoelectric element 10 and frequency dependence of impedance was measured while applying a measurement signal at +4 dBm. Then, referring to the waveform of frequency characteristic around the resonance frequency of each piezoelectric element 10, piezoelectric elements 10 that exhibited impedance peak value exceeding a given threshold at the resonance frequency were determined to have no cracks. Also, piezoelectric elements 10 that exhibited impedance peak value not exceeding the given threshold at the resonance frequency were determined to have cracks.

The comparative example was subjected to the property inspection by using the tray 102 shown FIG. 7A. The tray 102 has 100 recesses 104 formed therein. Using a loading jig, 100 piezoelectric elements 100 were put in the 100 recesses 104, one piezoelectric element 100 in each recess 104. Subsequently, a voltage of 53±2 V was applied between the pair of electrodes of each piezoelectric element 100 to perform property inspection. The comparative example was also subjected to capacitance inspection and resonance inspection according to the same method as that of the example.

[Evaluation]

In the example and comparative example, the ratio of the number of normally polarized piezoelectric substrate pieces to the 100 piezoelectric elements, i.e., (the number of normal pieces/100)×100(%) was calculated as the yield. As a result, the example showed a ratio of 80% and the comparative example 60%.

Further, the retry rate of polarization treatment was examined for the example and the comparative example. The comparative example showed 200 retries per 1000 test pieces, resulting in a retry rate of 0.2. In contrast, the example showed 30 retries per 1000 test pieces, resulting in a low retry rate of 0.03.

"Retry" in the example and comparative example means that polarization treatment or measurement is conducted again (i.e., re-inspection) by bringing the probe into contact with each piezoelectric element again, when the property value measured by bringing the probe into contact therewith was not correct. "Retry rate" means the rate of the number of retries to the number of test pieces, i.e., the number of retries/the number of test pieces.

The retry rates about the inspections were confirmed for the example and comparative example. The comparative example showed 100 re-inspections per 1000 test pieces in the capacitance inspection, resulting in a retry rate of 0.1. In contrast, the example showed 8 re-inspections per 1000 test pieces in the capacitance inspection, resulting in a retry rate of 0.008. Further, the comparative example showed 300 re-inspections per 1000 test pieces in the resonance inspection, resulting in a retry rate of 0.3. In contrast, the example showed 30 re-inspections per 1000 test pieces in the resonance inspection, resulting in a retry rate of 0.03.

The results above showed that fixing the piezoelectric elements 10 on the slightly adhesive sheet 30 offers decreased retry rate and improved yield, as compared to the case where the piezoelectric elements 100 are held only with the frame of the tray 102, using the tray 102 as shown in FIG. 7A without using the slightly adhesive sheet 30.

The piezoelectric element inspection method according to the present invention is not limited to the above-described embodiments and various configurations are of of the present invention.

The invention claimed is:

1. A piezoelectric element inspection method for performing an electric property evaluation of a piezoelectric element by applying a voltage to the piezoelectric element, the method comprising:
    a first step of holding the piezoelectric element on a flat-plate-shaped slightly adhesive sheet, the slightly adhesive sheet has properly values including a surface resistance equal to or greater than $10^{16}$ ohms, a Young's modulus of 5.0 to 10.0 MPa, a heat conductivity equal to or greater than 0.05 W/mK, a holding power equal to or less than 0.50 kgf/cm$^2$, and a heat resistance equal to or higher than 90° C; and
    a second step of applying the voltage to the piezoelectric element held on the slightly adhesive sheet to perform the electric property evaluation of the piezoelectric element.

2. The piezoelectric element inspection method according to claim 1, wherein
    the piezoelectric element has a first terminal and a second terminal formed on one surface thereof,
    the first step holds, on the slightly adhesive sheet, another surface of the piezoelectric element that is opposite to the one surface, and
    the second step applies the voltage between the first terminal and the second terminal of the piezoelectric element.

3. The piezoelectric element inspection method according to claim 1, wherein the piezoelectric element has a size having a length of 0.2 to 0.4 mm, a width of 0.8 to 1.2 mm, and a thickness of 0.05 to 0.2 mm.

4. The piezoelectric element inspection method according to claim 1, wherein, when the piezoelectric element is subjected to the voltage for the electric property evaluation, a strain of 1500 to 4000 ppm in a d31 direction occurs with an electric field of 2.0 to 4.0 kV/mm.

5. The piezoelectric element inspection method according to claim 1, wherein
    the flat-plate-shaped slightly adhesive sheet is bonded on a base material, and
    the base material is flat in at least a plane on which the slightly adhesive sheet is bonded, and the slightly adhesive sheet is bonded within the plane.

6. The piezoelectric element inspection method according to claim 1, wherein the slightly adhesive sheet holds the piezoelectric element and does not hinder a displacement of the piezoelectric element that occurs when the voltage is applied.

7. The piezoelectric element inspection method according to claim 1, wherein the slightly adhesive sheet comprises at least one of relations (a) to (d) between a thickness ta and a dielectric loss tangent tan$\theta$:
    (a) tan$\theta \leq 0.20$ when 0.03 mm$\leq$ta$\leq$0.05 mm
    (b) tan$\theta \leq 0.15$ when 0.05 mm$\leq$ta$\leq$0.10 mm
    (c) tan$\theta \leq 0.10$ when 0.10 mm$\leq$ta$\leq$0.20 mm
    (d) tan$\theta \leq 0.05$ when 0.20 mm$\leq$ta$\leq$0.50 mm.

* * * * *